United States Patent
Baillon et al.

(10) Patent No.: US 7,495,822 B2
(45) Date of Patent: Feb. 24, 2009

(54) FREQUENCY SHIFTER IN AN OPTICAL PATH CONTAINING A CONTINUOUS LASER SOURCE

(75) Inventors: Bertrand Baillon, Valence (FR); Jean-Pierre Schlotterbeck, Samson (FR); Alain Renard, Chabeuil (FR)

(73) Assignee: Thales, Neuilly sur Seine (FR)

( * ) Notice: Subject to any disclaimer, the term of this patent is extended or adjusted under 35 U.S.C. 154(b) by 64 days.

(21) Appl. No.: 10/592,587

(22) PCT Filed: Mar. 11, 2005

(86) PCT No.: PCT/EP2005/051104

§ 371 (c)(1),
(2), (4) Date: Sep. 12, 2006

(87) PCT Pub. No.: WO2005/099051

PCT Pub. Date: Oct. 20, 2005

(65) Prior Publication Data

US 2007/0206190 A1 Sep. 6, 2007

(30) Foreign Application Priority Data

Mar. 12, 2004 (FR) .................................. 04 02600

(51) Int. Cl.
*G02F 1/35* (2006.01)
*G01P 3/36* (2006.01)

(52) U.S. Cl. .................... 359/326; 385/8; 356/5.09; 356/28.5

(58) Field of Classification Search ......... 359/326–330; 356/28.5, 5.09; 385/2, 8
See application file for complete search history.

(56) References Cited

U.S. PATENT DOCUMENTS

| | | | |
|---|---|---|---|
| 3,435,230 A | 3/1969 | Courtney-Pratt et al. | |
| 4,329,664 A | 5/1982 | Javan | |
| 4,856,092 A * | 8/1989 | Wade | 398/200 |
| 5,847,817 A | 12/1998 | Zediker et al. | |
| 6,141,086 A | 10/2000 | Vahala et al. | |
| 7,161,528 B2 | 1/2007 | Kirby et al. | |
| 7,206,546 B2 | 4/2007 | Renard et al. | |
| 7,336,736 B2 | 2/2008 | Leblond et al. | |
| 7,352,447 B2 | 4/2008 | Schlotterbeck et al. | |
| 7,352,476 B2 | 4/2008 | Baillon et al. | |
| 7,386,034 B2 | 6/2008 | Korpet et al. | |
| 2002/0075475 A1 | 6/2002 | Holton | |
| 2002/0154383 A1 * | 10/2002 | Oron et al. | 359/326 |

(Continued)

FOREIGN PATENT DOCUMENTS

CA    2 476 805    8/2003

(Continued)

*Primary Examiner*—Hemang Sanghavi
(74) *Attorney, Agent, or Firm*—Lowe Hauptman Ham & Berner, LLP

(57) ABSTRACT

The present invention relates to a frequency shifter in an optical path containing a continuous laser source, and it comprises at least two frequency shift modules placed in parallel and each containing an optical propagation medium, the optical path length of which is modified according to the desired frequency shift, each of these modules being controlled separately, this shifter comprising a switch (14) which is connected to the outputs of these modules and is controlled so as to choose, at each instant, the module providing the desired frequency shift, the switch delivering, at its output, a continuous optical beam whose frequency is adjusted by contiguous sections.

11 Claims, 2 Drawing Sheets

U.S. PATENT DOCUMENTS

| | | |
|---|---|---|
| 2003/0103211 A1 | 6/2003 | Lange et al. |
| 2003/0198271 A1 | 10/2003 | Matveev |
| 2007/0159683 A1 | 7/2007 | Baillon et al. |
| 2007/0206190 A1 | 9/2007 | Baillon et al. |

FOREIGN PATENT DOCUMENTS

| | | |
|---|---|---|
| EP | 0 536 783 A | 4/1993 |
| EP | 0601847 A1 | 6/1994 |
| EP | 1 055 941 A | 11/2000 |
| FR | 2757640 A1 | 6/1998 |

* cited by examiner

FREQUENCY SHIFTER IN AN OPTICAL PATH CONTAINING A CONTINUOUS LASER SOURCE

The present invention relates to a frequency shifter in an optical path containing a continuous laser source.

In devices containing a continuous laser source and heterodyne coherent detection, it may be necessary to determine a frequency variation (Doppler effect) that occurs over part of the path of the laser beam, resulting from a physical phenomenon that it is desired to compensate for or measure. This is in particular the case with lidars used for measuring wind speed and direction by the backscattering of the laser beam from aerosol particles carried by the wind. This frequency variation is generally determined by mixing the received signal with a signal generated by a local oscillator affected by a permanent frequency shift produced by an electrooptic or acoustooptic modulator.

Such a modulator device is expensive, bulky and not very discreet, as it radiates at high frequency (presence of harmonics of the fundamental frequency of the signal, which are liable to disturb the signal processing carried out downstream), with a risk of reducing the precision of the speed measurement and of narrowing the spectral measurement window.

Document CA 2 476 805 discloses a fiber-optic sensor in which a light signal is modulated according to physical phenomena that act on the length of an optical path. The measurement device of this interferometric sensor receives phase-shifted pulse-modulated signals in each of the two channels and mixes the modulated optical signals so as to obtain an interference signal indicative of the distance to be measured. This interferometric device does not provide a constant and permanent frequency shift function.

The subject of the present invention is a frequency shifter in an optical path containing a continuous laser source, which shifter is as inexpensive as possible and compact, is not a source of unwanted radiation and can be integrated into a fiber-optic architecture.

The shifter according to the invention is characterized in that it comprises at least two frequency shift modules placed in parallel and each containing an optical propagation medium, the optical path length of which is modified according to the desired frequency shift, each of these modules being controlled separately, this shifter comprising a switch which is connected to the outputs of these modules and is controlled so as to choose, at each instant, the module providing the desired frequency shift, the switch delivering, at its output, a continuous optical beam whose frequency is adjusted by contiguous sections.

According to one advantageous feature of the invention, for each of said contiguous sections, the variation in the optical path length of the optical propagation medium is a linear variation, this variation taking place by means of a triangular modulation law, the slopes of the rising or falling segments of the triangular modulation law remain identical over time throughout the duration of application of the modulation signal.

According to another advantageous feature of the invention, the slopes of the rising or falling segments vary over time in order to obtain a variable frequency shift of the "chirp" type.

The optical propagation medium may either be an optical fiber, an optical waveguide or an electrooptic crystal. If the system in which the frequency is varied is a lidar, the variation in the optical path length of the optical propagation medium is advantageously a linear variation, and this is achieved by varying in a linear manner the stress applied to the optical fiber or to the waveguide, or by varying the voltage applied to the electrooptic crystal.

Advantageously, at least two frequency shift modules are connected in parallel, their respective triangular modulations being identical but phase-shifted, a switch being connected to the outputs of these modules and controlled in order to collect, alternately, the optical beam the frequency shift of which is constant.

The present invention will be more clearly understood on reading the detailed description of one embodiment, given by way of nonlimiting example and illustrated by the appended drawing in which.

The present invention will be described below with reference to a lidar, but of course it is not limited to this single application - it may be used in various fields in which there is a need to produce a frequency shift over high frequencies, such as frequencies above a few GHz.

Figure 1:
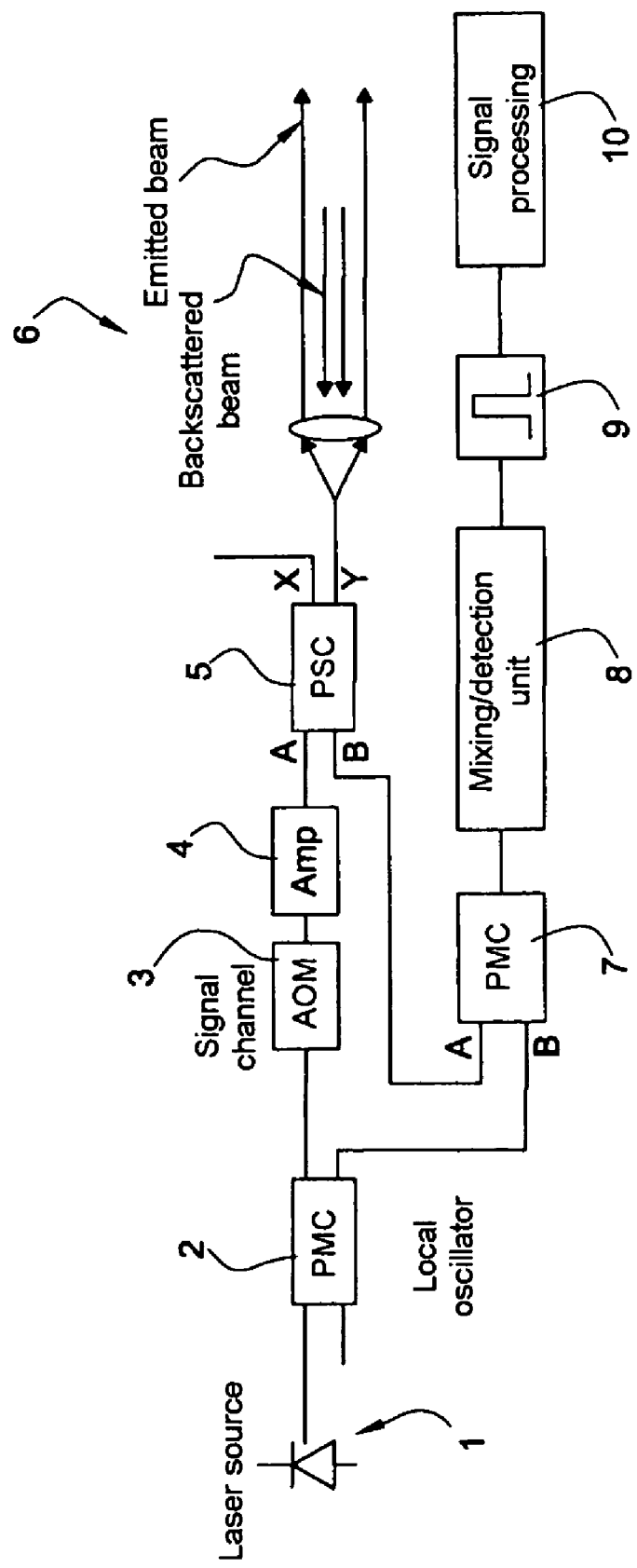
FIG. 1 is a simplified block diagram of a lidar of the prior art, of the type mentioned in the preamble.

FIG. 1 shows a block diagram in which a laser source 1 is connected to one input of a polarization-maintaining coupler 2. A first output of the coupler 2, corresponding to the "signal" channel, is connected to an acoustooptic modulator 3 followed by an amplifier 4. The amplifier 4 is connected to a first terminal of a polarization-splitting coupler 5. One output of the coupler 5 is connected to a lidar beam emitter/receiver system, indicated in its entirety by the reference 6. The second output of the coupler 2 is connected to a first input of a polarization-maintaining coupler 7, the other input of which is connected to the coupler 5. The output of the coupler 7 is connected to a mixing/detection unit 8, followed by a filtering circuit and signal processing circuits 10.

Figure 2:
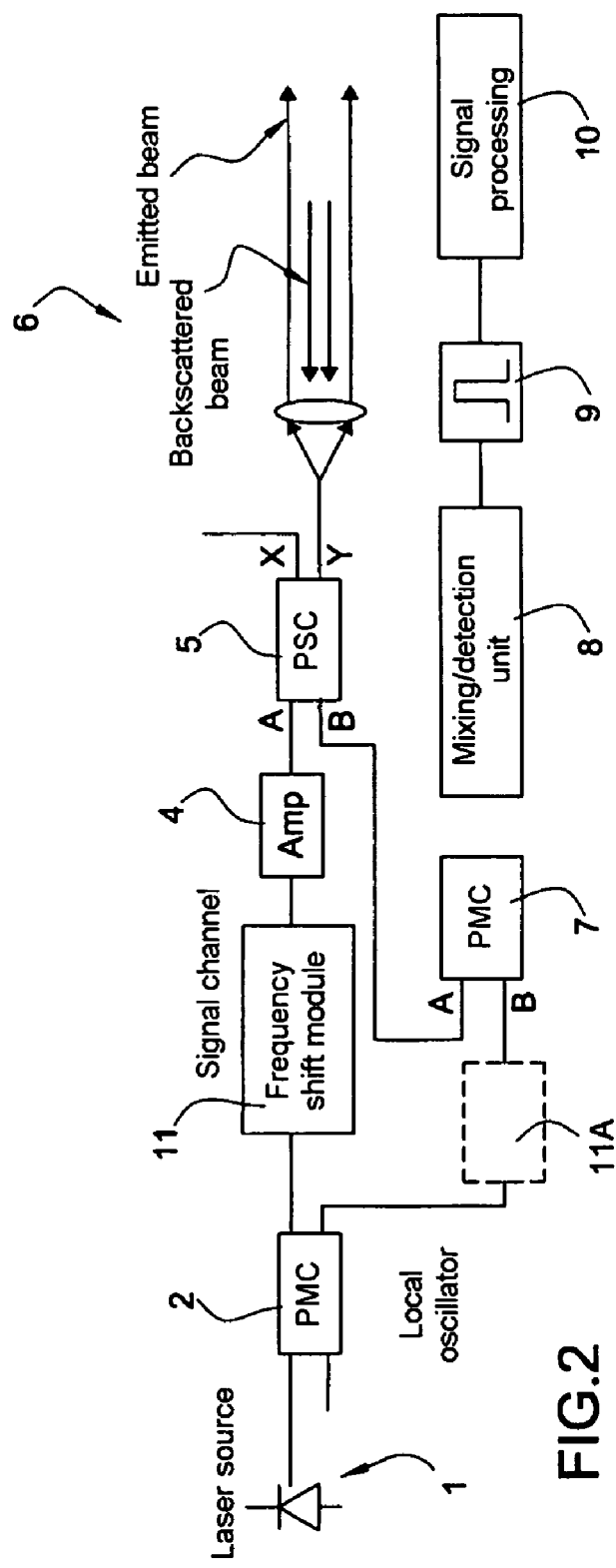
FIG. 2 is a simplified block diagram of a lidar comprising a frequency shift circuit according to the invention.

In the block diagram shown in FIG. 2, the elements similar to those of FIG. 1 are assigned the same numerical references. The essential difference between the systems of FIGS. 1 and 2 is that the modulator 3 of FIG. 1 has been replaced with a shifter 11 having frequency shift modules. The other components of the system shown in FIG. 2 may be the same as those shown in FIG. 1.

The shifter 11 may comprise one or more elementary frequency shift modules. Each of these elementary modules comprises an optical propagation medium, such as an optical fiber, an optical waveguide or an electrooptic crystal. This medium is acted upon so as to vary the optical path length thereof. This variation in path length corresponds to a variation in the refractive index of the optical medium. If this medium is an optical fiber or a waveguide, this variation may be obtained by imposing a mechanical stress on the optical medium. If it is an electrooptic crystal, the variation is obtained by applying a suitable electrical voltage to its electrodes. In this regard, it is important to note that the electrooptic crystal then does not operate as a conventional electrooptic modulator, but as a device for introducing a shift, which is fixed or variable, in the frequency of the laser beam that it receives.

The variation in the mechanical stress or in the electrical voltage must be, in the present case, a linear variation as a function of time. This linear variation generates a constant Doppler shift, and consequently a fixed frequency shift between the "signal" and "local oscillator" channels, thereby allowing heterodyne coherent detection. This Doppler shift is imposed on the "signal" channel into which the shifter 11 (as shown by the continuous line in FIG. 2) and/or on the "local oscillator" channel (the second shift module device is then referenced 11A and indicated in FIG. 2 by the broken lines). A variation in the optical path length is generated when velocity of the beam passing through the shifter 11 (and/or 11A) varies. This velocity varies inversely proportionally to the refractive index of the medium through which the beam passes. According to the invention, the optical path length in the device 11 (and/or 11A) is varied linearly as a function of time, thereby generating a constant Doppler shift.

Figure 3:
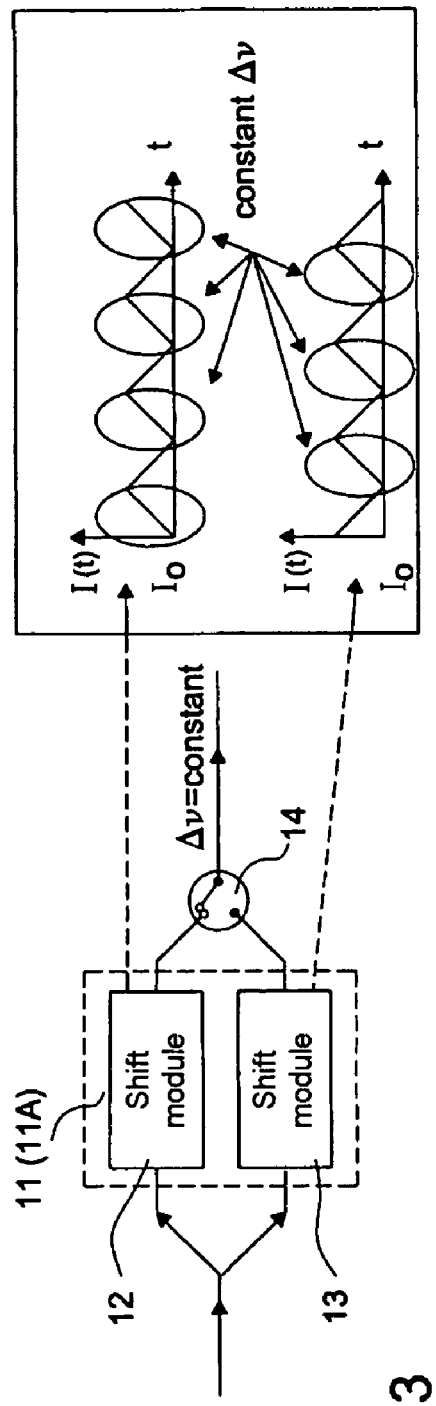
FIG. 3 is a simplified block diagram of an example of a combination of two frequency shift modules according to the invention.

According to one advantageous embodiment of the invention, and as shown in FIG. 3, the device 11 (and/or 11A) is provided with two identical shift modules 12, 13, which are connected in parallel and followed by a switch 14. Of course, the shifter 11 (and/or 11A) may comprise more than two modules. In each of the modules 12, 13, an identical triangular modulation is applied, the modulation in one of the two modules being phase-shifted, for example by π, relative to the other. However, such a value is not absolutely necessary, it being sufficient for the two channels to be shifted by a half-period in such a way that, at the output of the switch, the frequency shift is always constant. The rising and falling slopes of these triangular modulations may be identical, but they may also be different, for example the falling slope may be much steeper than the other slope. In the present case, only the rising slopes are used, by switching the switch 14 to the output of the module 12 and to the output of the module 13, alternately. The phase shift between the two triangular modulations must be such that the apex of the ascending part of one corresponds at least to the start of the ascending part of the other. Thus, what is obtained at the output of the switch 14 is a continuous optical beam, the frequency of which is adjusted by contiguous sections.

However, according to a variant of the invention, either only a single shift module is used, the switch 14 then being omitted, or at least two modules are used, but in both cases only one modulation part (for example the ascending part) among n consecutive parts, of the same direction of variation (n possibly being greater than 2 or even greater than 10) is used. Such a feature requires the emission of the laser beam to be interrupted during generation of the modulation parts not used (rising and/or falling parts), but it does make it possible to resolve any doubt on awaiting the arrival of the actual echo, corresponding to a laser beam portion emitted during a rising modulation part, before the next beam portion is emitted.

According to an alternative embodiment of the invention, the laser beam is passed two or more times through the shifter. The first reason for this is an economic reason: if the voltage slope applied is insufficient to obtain the desired shift over the duration of the pulse, the beam is made to pass through the module again in order to achieve the desired final shift. The second reason is that the shift module could very well be located behind the coupler 5, just before the emission of the beam into the atmosphere, in which case the backscattered beam could itself undergo a shift (identical to or the reverse of the initial shift, or another shift).

The frequency shift generated by the shifter 11 (and/or 11A) may be controlled by the measured value of the shift at the output of each shift module. The electrooptic control voltage or the mechanical stress applied to the optical propagation medium of these modules (and therefore the slope and the waveform of the corresponding modulation, and consequently the law of variation of the frequency shift) may therefore be slaved to a fixed or variable value, according to a defined law that depends on the application in question, such as, for example, in the case when "narcissus" effects (i.e. parasitic reflections) occur. This frequency shift measurement may be used in the postprocessing carried out in the signal processing circuits for processing the backscattered signal. The invention is also applicable when SSB mixing (in phase and in quadrature) is carried out.

There are many applications of the device of the invention. Apart from the application considered here to telemetry and velocimetry lidars, with, as the case may be, "chirped" beams, mention may be made of telecommunications (for example multiplexers and demultiplexers, etc.).

The shifter of the invention, thanks to the conventional acoustooptic or electrooptic modulator being replaced with a shifter introducing an optical path length variation, makes it possible to prevent the emission of disturbing harmonics and to avoid producing radio frequency modulation. The mechanical or electrical stresses involved in this shifter are low, and therefore easy to produce. The electrooptic technologies employed by the invention are derived from those commonly employed in telecommunications, the components used being compact and inexpensive, since they are produced in integrated technology. It is also possible to reduce the costs of these components by hybridizing them on a planar waveguide, thereby reducing the number of wire and optical-fiber connections.

The invention claimed is:

1. A frequency shifter in an optical path containing a continuous laser source, comprising:
   at least two frequency shift modules placed in parallel and each having an optical propagation medium, the optical path length of which is modified according to the desired frequency shift, each of these modules being controlled separately, including a switch which is connected to outputs of these modules and which is controlled so as to choose, at each instant, the module providing the desired frequency shift, the switch delivering, at its output, a continuous optical beam whose frequency is adjusted by contiguous sections.

2. The shifter as claimed in claim 1, wherein each of said contiguous sections, the variation in the optical path length of the optical propagation medium is a linear variation.

3. The shifter as claimed in claim 2, wherein the linear variation takes place according to a triangular modulation law.

4. The shifter as claimed in claim 3, wherein the slopes of the rising or falling segments of the triangular modulation law remain identical over time throughout a duration of application of the modulation signal.

5. The shifter as claimed in claim 3, wherein the slopes of the rising or falling segments of the triangular modulation law vary over time, in order to obtain a variable frequency shift.

6. The shifter as claimed in claim 1, wherein only one modulation part among n consecutive parts in the same direction of variation is used in order to resolve any doubt in the arrival of the echoes.

7. The shifter as claimed in claim 1, wherein a law of variation of the frequency shift is slaved to a fixed value.

8. The shifter as claimed in claim 1, wherein a law of variation of the frequency shift is slaved to a variable value.

9. The shifter as claimed in claim 1, wherein the optical propagation medium is one of the following devices: an optical fiber, a waveguide, or an electrooptic crystal.

10. The shifter as claimed in claim 1, wherein the optical path length comprises electrooptical means.

11. The shifter as claimed in claim 1, wherein the shifter is configured to pass the laser beams multiple times through the at least two frequency shift modules.

* * * * *